US010496931B2

(12) United States Patent
Schoennenbeck et al.

(10) Patent No.: US 10,496,931 B2
(45) Date of Patent: Dec. 3, 2019

(54) EXACT QUANTUM CIRCUITS AND CIRCUIT SYNTHESES FOR QUDIT AND MULTIPLE QUBIT CIRCUITS

(71) Applicant: Microsoft Technology Licensing, LLC, Redmond, WA (US)

(72) Inventors: Sebastian Schoennenbeck, Aachen (DE); Vadym Kliuchnikov, Redmond, WA (US); Alexei V. Bocharov, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/624,266

(22) Filed: Jun. 15, 2017

(65) Prior Publication Data

US 2018/0107939 A1     Apr. 19, 2018

Related U.S. Application Data

(60) Provisional application No. 62/410,330, filed on Oct. 19, 2016.

(51) Int. Cl.
*G06N 99/00* (2019.01)
*G06N 10/00* (2019.01)
*G06F 17/16* (2006.01)
*H03K 19/195* (2006.01)

(52) U.S. Cl.
CPC ............ *G06N 10/00* (2019.01); *G06F 17/16* (2013.01); *H03K 19/195* (2013.01)

(58) Field of Classification Search
CPC ..... G06N 99/002; G06F 17/16; H03K 19/195

USPC ............................................................ 326/1
See application file for complete search history.

(56) References Cited

FOREIGN PATENT DOCUMENTS

WO     2016164325 A1     10/2016

OTHER PUBLICATIONS

"International Search Report and Written Opinion Issued in PCT Application No. PCT/US2017/057213", dated Jan. 31, 2018, 14 Pages.
Giles, et al. ,"Exact Synthesis of Multiqubit Clifford+T Circuits", In Journal of Physical Review, vol. 87, Issue 3, Mar. 26, 2013, 7 Pages.
Hostens, et al., "Stabilizer States and Clifford Operations for Systems of Arbitrary Dimensions, and Modular Arithmetic", Retrieved from «https://arxiv.org/pdf/quant-ph/0408190v1.pdf», Aug. 31, 2004, 10 Pages.
Kaplansky, Irving, "Modules Over Dedekind Rings and Valuation Rings", In Journal of Transactions of the American Mathematical Society, vol. 72, Issue 2, Mar. 1, 1952, pp. 327-340.
Kliuchnikov, et al., "A Framework for Exact Synthesis", Retrieved from «https://arxiv.org/pdf/1504.04350.pdf», Apr. 16, 2015, 40 Pages.
Saeedi, et al., "Synthesis and Optimization of Reversible Circuits—A Survey", Retrieved from «https://arxiv.org/pdf/1110.2574v1.pdf», Oct. 12, 2011, 34 Pages.
International Preliminary Report on Patentability from International Application No. PCT/US2017/057213, dated Apr. 23, 2019, 10 pages.

*Primary Examiner* — Seokjin Kim
(74) *Attorney, Agent, or Firm* — Klarquist Sparkman, LLP

(57) ABSTRACT

Methods are provided for exact synthesis of unitaries for qudit and multi-qubit systems. In addition, state preparation methods are provided. The syntheses produce circuits that have lowest cost for a given cost function.

21 Claims, 4 Drawing Sheets

US 10,496,931 B2

EXACT QUANTUM CIRCUITS AND CIRCUIT SYNTHESES FOR QUDIT AND MULTIPLE QUBIT CIRCUITS

CROSS-REFERENCE TO RELATED APPLICATIONS

This application claims the benefit of U.S. Provisional Patent Application 62/410,330, filed Oct. 19, 2016, which is incorporated herein by reference.

FIELD OF THE INVENTION

The disclosure pertains to exact synthesis of qudit and multiple qubit quantum circuits.

1. BACKGROUND

Quantum computers promise to make many computationally challenging problems tractable. For example, determining prime factors of large integers is generally not possible using conventional computers, but such factorization is well suited to quantum computation. Already some authorities recommend that information that is to be stored securely should be protected with quantum-safe encryption protocols.

Qubits, qutrits, qudits, and the like can be implemented in various ways. For example, spin qubits can be based on spins of charged particles trapped in solid substrates, such as nitrogen vacancy centers in diamond. Alternatively, superconducting circuits, ion traps, or photonic circuits can be used. Unfortunately, systems for implementing operations on qubits, qutrits, or other quantum devices tend to be expensive. To take advantage of the capabilities offered by quantum computing, improved methods and apparatus for selecting quantum gates from a set of available gates to represent any particular operator are needed, especially for qutrits, qudits, and multi-qubit systems.

2. SUMMARY

Disclosed are methods for decomposing a unitary into a quantum circuit and finding a circuit that prepares a given state on a quantum computer. The methods find a circuit by gradually decreasing the complexity of the unitary or the quantum state. The complexity of the unitary or the state is measured using the structure of a quotient of torsion-free modules associated with the unitary or the state. The relevant part of the structure of the quotient of torsion-free modules is described by an integer vector consisting of p-adic valuations of elementary divisors of the quotient. The complexity is decreased if the vector of integers becomes smaller with respect to a total order on integer vectors.

Exact synthesis methods of unitaries for qudit and multiple qubit quantum computing systems include a series of basis gates arranged based on lexicographical or other orderings obtained using products of the basis gates with a torsion free module L of rank d and modules M' associated with products of a previously selected basis gate and a module M. Typically, quantum states are representable as vectors of length d, wherein d is an integer greater than or equal to 2, and the unitary is represented as a square matrix of dimension d over a ring R. A final gate in the series is defined as $u=(U^\dagger r)^\dagger$, wherein r is a product of the other selected basis gates. In some cases, state preparation methods are also provided.

3. BRIEF DESCRIPTION OF THE DRAWINGS

4. DETAILED DESCRIPTION

Figure 1:
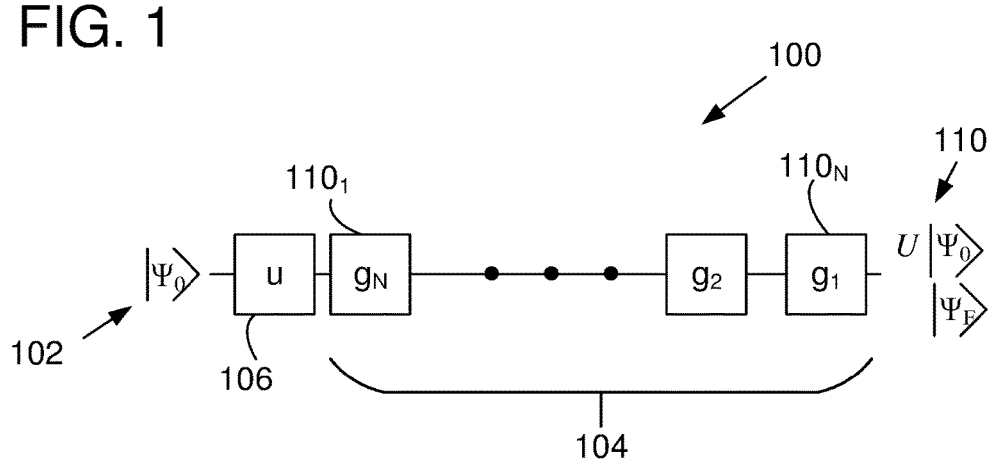
FIG. 1 illustrates a representative quantum circuit for exact implementation of a unitary or exact state preparation.

Quantum circuit synthesis methods and apparatus are disclosed below, along with quantum circuits based on such syntheses. Quantum computing operations are generally described using unitary matrices (unitaries) U that are associated with a particular problem to be solved. The unitary U is provided to a synthesis tool that outputs a series of quantum gates that exactly or approximately represents U. Such synthesis typically uses mathematical representations of gates from a set of available gates. Quantum circuit implementations are often limited to operations on quantum systems having two quantum states; in the examples disclosed herein, the operations (and the associated unitary U and its synthesized representation) can be applied to quantum systems having multiple qubits, three states (qutrits), d states (qudits), wherein d is an arbitrary integer greater than 1. A selected series of gates can be evaluated based on a so-called cost function that reflects, for example, the difficulty or expense associated with each gate of the selected series. The cost function is often a simple sum of the costs each of the gates in the series of gates.

As used herein, "quantum gate" or "gate," and other such terms refer to mathematical or other representations of the associated functions that a particular circuit can perform on a quantum system. Gates are typically illustrated as square matrices of dimension d, wherein d is a positive integer. The terms qubit, qutrit, qudit, and the like refer to mathematical representations of corresponding quantum systems, generally as row or column vectors of dimension d, such as d=2, 3, or 4. These terms also refer to the associated physical implementations discussed above. Quantum circuit thus can refer to a sequence of physical gates (or a single physical gate) or a representation of a quantum circuit such as mathematical representation. Generally, whether such terms refer to physical systems or representations thereof will be apparent from the context.

The disclosure pertains to methods of quantum circuit design and associated quantum circuits. Typically, an exact synthesis for an arbitrary unitary is intended using a predetermined set of quantum gates. Thus, solutions to the following problem are desired:

Problem 1 (Exact synthesis). Given:
(1) Integer d and commutative ring R with involution
(2) Unitary d×d matrix U over the ring R
(3) Set G of d×d unitary matrices over the ring R.
Find: Sequence $g_1, \ldots, g_n$ from G such that $U=g_1 g_2 \ldots g_n$ that defines a quantum circuit.

The resulting sequence defines a circuit $g_n, \ldots, g_0$. This is referred to as an exact synthesis problem. For certain choices of R and G, exact synthesis methods are important tools for compiling quantum algorithms for quantum computers. The set G generally includes the set of available gates for use in circuit synthesis, and is sometimes referred to a basis set and the gates referred to as basis gates.

The solution to the exact synthesis problem is not generally unique, in some cases, the quality of two solutions can be compared as follows. For a given unitary U, an exact synthesis can be described as:

$$U = g_1 g_2 \ldots g_n = g'_1 g'_2 \ldots g'_{n'},$$

wherein $g_k$ and $g'_{k'}$ refer to basis gates in the same or different basis gate set. Cost can be assigned to elements of G, in other words for each element of g, a real number cost(g) is assigned. The specific choice of this numbers depends on the application. The cost of the sequence $g_1, \ldots, g_n$ or the cost of the corresponding quantum circuit is the sum cost($g_1$)+ . . . +cost($g_n$). One exact synthesis algorithm is better then another if it finds sequences of smaller cost. In some cases, it can be determined that an exact synthesis algorithm finds a decomposition with the smallest possible cost. In this case, the method is referred to as optimal (for given d, R, G and cost function).

While synthesis of gates that realize a particular unitary U is important, a synthesized quantum circuit is often selected to produce a desired quantum state. Thus, in some disclosed examples, methods are provided for state preparation. These are the algorithms that solve the following problem:

Problem 2 (Exact state preparation). Given:
(1) Integer d and commutative ring R with involution
(2) d dimensional vector $|s\rangle$ over ring R of squared length 1
(3) Set G of d×d unitary matrices over the ring R.

Find: Sequence $g_1, \ldots, g_n$ from G such that $|s\rangle = g_1 g_2 \ldots g_n |0\rangle$ wherein $|0\rangle = (1, 0, \ldots, 0)^T$ is a d dimensional vector.

Similarly to exact synthesis algorithms, one state preparation algorithm is better then another if it finds sequences of smaller cost.

4.1. Definitions

To avoid possible confusion, some definitions are provided herein.

Definition.

An involution in commutative ring (or field) is a map $*: R \to R$ such that

* is an automorphism of R
image of R under * is equal to R and map * has an inverse
for all a, b from R (a+b)* = a* + b*
for all a, b from R (a·b)* = a*·b*
for all a from R (a*)* = a Complex conjugation is an involution of the field of complex numbers $\mathbb{C}$.

Definition.

A unitary matrix of size d×d over ring R with involution * is a matrix with entries in the ring R such that $UU^\dagger = I$ where $\dagger$ is a conjugate transpose operation defined with respect to the involution *.

For example $$U = \begin{pmatrix} r_{1,1} & r_{1,2} \\ r_{2,1} & r_{2,2} \end{pmatrix}, r_{i,j} \in R$$

is a 2×2 matrix over the ring R and given * is an involution defined on R, the conjugate transpose is:

$$U^\dagger = \begin{pmatrix} r^*_{1,1} & r^*_{2,1} \\ r^*_{1,2} & r^*_{2,2} \end{pmatrix}.$$

Ring, field, ring automorphism and field automorphism are well-known mathematical concepts.

Definition.

The length squared of the vector $(v_1, \ldots, v_d)^T$ with entries in the ring R is equal to $\Sigma_{k=1}^{d} v_k v^*_k$.

The length itself is not always well defined.

4.2. Exact Synthesis Algorithms

A general framework for exact synthesis algorithms is shown in Algorithm 1. Specific methods are determined based on specific sets of input parameters that can include:

K is a number field with involution * (in other words a field automorphism of order 2)
$O_K$ is a ring of integers of the number field K
R is a sub-ring of K
p is a prime ideal of $O_K$
L is a torsion free $O_K$ module of rank d (such L is also called $O_K$-lattice)
$\preceq$ is a total order on d dimensional vectors whose entries are non-negative integers
$G_{ED}$ is a finite set of unitaries over ring R
$G_L$ is the set of all unitaries over R that map L to itself.

The algorithm solves exact synthesis problem for unitaries over ring R and for $G = G_{ED} \cup G_L$. The algorithm of Algorithm 1 can be implemented in a computer algebra system, for example, in the PARI-GP or Magma Computational Algebra Systems ("Magma"). One key part of the algorithm is the procedure DIST described below.

---
Algorithm 1 Lattice based exact synthesis algorithm
---

Input: U is a unitary over ring R
Output: Sequence $g_1, \ldots, g_n$, u where $g_k$ are from $G_{ED}$, u is from $G_L$ and $U = g_1 \cdot \ldots \cdot g_n \cdot u$
1: M ← MODULE-MULTIPLY(U, L)
2: NEIGHBORS ← {⟨g, MODULE-MULTIPLY(g, L)⟩ : g ∈ $G_{ED}$}
3: w ← empty ordered sequence
4: while IS-EQUAL(M, L) do
5:     NEIGHBORS-DIST ← {⟨g, DIST(p, M', M)⟩ :⟨g, M'⟩ ∈ NEIGHBORS}
6:     Find an element ⟨h, v⟩ of NEIGHBORS-DIST such that v is smallest possible with respect to order $\preceq$
7:     M ← MODULE-MULTIPLY($h^\dagger$, M)
8:     Append h to w
9: end while
10: r ← Product of all elements of w according to their order in w
11: u ← $(U^\dagger \cdot r)^\dagger$
12: Append u to w
13: return w

---

The parameters of the computer-implemented algorithm and its inputs and outputs are described below, followed by a discussion of each line in more detail.

4.2.1. Algorithm Parameters, Inputs and Outputs.

(1) [Number field K] Data structures for representing number fields and their elements are well known. See, for example, Chapter 4 of Henri Cohen, *A Course in Computational Algebraic Number Theory* (Springer 2000) ("Cohen 2"). Data structures and related algorithms are implemented in Magma or PARI-GP. For example, see "Global Arithmetic Fields" as described in the Magma Handbook Handbook ("Magma-HB").

(2) [Ring of integers $O_K$ and ideals of $O_K$] Algorithms for computing the ring of integers of a number field are well known. Data structure for representing rings of integers, their elements and ideals of rings of integers are well known, too. For example, see Chapter 4 of Cohen 2. The algorithms and data structures are also implemented in Magma or PARI-GP. For example see "Global Arithmetic Fields," "Number Fields and Orders" in Magma-HB.

(3) [R is a sub-ring of K] Because R is a sub-ring of K we can use data structures for elements of K to represent elements of R. Data structures to represent elements of R or to perform operations with elements of R are not necessary. To check that the input is valid it is useful to have a procedure that checks if element of K is in R. Such a procedure can be easily implemented for all the examples of R considered below.

(4) [Involution*]. The involution is implemented as a function that takes data structure representing element of K as an input and outputs data structure representing another element of K. Implementation of such a function is very simple.

(5) [Prime ideal $\cap$ of $O_K$]. The ideal is a special case of ideal of ring of integers $O_K$ and is discussed above.

(6) [L is a torsion free $O_K$ module of rank d] Such modules can be represented using pseudo-matrices as described in Chapter 1 of Henri Cohen, *Advanced Topics in Computational Number Theory* (Springer 2000) ("Cohen 1"). Implementations of corresponding data structures are available in Magma and PARI-GP together with algorithms for manipulating them. For example, see "Modules" and "Modules Over Dedekind Domains" in Magma-HB.

(7) [$\preceq$ is a total order on d dimensional vectors whose entries are non-negative integers] Such an order can be implemented as a function that takes two d dimensional vectors $v_1$, $v_2$ as an input. The function returns TRUE if $v_1 \preceq v_2$ and FALSE otherwise. The functions corresponding to total orders are easy to implement.

(8) [$G_{ED}$ is a finite set of unitaries over ring R], Input: [U is a unitary over ring R], Output: [Sequence $g_1, \ldots, g_n$, u of unitaries over ring R]. A unitary over ring R can be represented as a matrix over field F. Such a matrix can be represented as a sequence of elements of F. Data structures for such matrices are implemented in Magma and PARI-GP. For example, see "Matrices and Linear Algebra" and "Matrices" in Magma-HB. Set $G_{ED}$ is represented as a sequence of matrices with entries in number field K.

(9) [$G_L$ is the set of all unitaries over R that map L to itself] This set need not be specified for the disclosed methods to work. The set $G_L$ is also uniquely defined by L. However, $G_L$ must be finite for exact state preparation. In that case, $G_L$ is specified as a finite sequence of matrices with entries in number field K.

4.2.2. Algorithm Details.

Line 1. MODULE-MULTIPLY function computes a new module M equal to

M={Uv:v∈L}. Note that v∈L are elements of $K^d$ (d dimensional vector space with a field of scalars K), therefore product Uv is well defined because U is d×d matrix over field K. Recall that torsion free $O_K$ modules of rank d are usually represented by a sequence of fractional ideals of length d and sequence of elements of $K^d$ of length d. (See Corollary 1.2.25 in Cohen 1). Then:

L=$\mathfrak{d}_1 v_1 + \ldots + \mathfrak{d}_d v_d$, where $\mathfrak{d}_k$ are fractional $O_K$ ideals, $Uv_k$ are from $K^d$ Then module M can be computed using d matrix vector multiplications over field K M=$\mathfrak{d}_1 Uv_1 + \ldots + \mathfrak{d}_d Uv_d$ where $\mathfrak{d}_k$ are fractional $O_K$ ideals, $Uv_k$ are from $K^d$ Line 2. Here a sequence of tuples ⟨g, M'⟩ is computed. A first element in the tuple g is a unitary over the ring R (represented as a matrix with entries in the field K) and a second element of the tuple represents module M'={gv:v∈L}. The function MODULE-MULTIPLY described above is used. The sequence representing set $G_{ED}$ is of finite length, therefore the sequence NEIGHBORS can be easily computed. Alternatively one can rewrite Line 2 as the following FOR loop:

```
NEIGHBORS ← empty ordered sequence
for k = 1 to LENGTH(G_ED) do
    g ← k-th element of sequence G_ED
    M' ← MODULE-MULTIPLY (g, L)
    append⟨g, M'⟩ to NEIGHBORS
end for
```

Line 4. Here the equality of two $O_K$-modules M and L is tested. One way to test such equality is to transform the representation of M and L to a Hermite Normal Form, as described in Chapter 1.4.2 of Cohen 1. The basic algorithms for $O_K$-modules (special case of modules over Dedekind domains) are described in Chapter 1.5.2 of Cohen 1 and include equality testing. Such algorithms are also readily available in Magma and PARI-GP. For example, see "Modules" and "Modules Over Dedekind Domains" in Magma-HB.

Line 5. A sequence of tuples ⟨g, v'⟩ where g is a unitary over the ring R and v is a d dimensional vector of non-negative integers is computed. This line can be written as the following FOR loop:

```
NEIGHBORS-DIST ← empty ordered sequence
for k = 1 to LENGTH(NEIGHBORS) do
    ⟨g, M'⟩ ← k-th element of sequence NEIGHBORS
    v' ← DIST (P, M, M')
    append ⟨g, v'⟩ to NEIGHBORS
end for
```

Procedure DIST is described and discussed in more detail later.

Line 6. This line can be performed using various selection algorithms such as those based on sorting, partial sorting of other selection algorithms that can identify minimum, maximum, or other elements of a sequence. This can be expressed equivalently using the following:

V←{v:⟨g, v⟩∈NEIGHBOIS-DIST}

$v_{min}$←Minimum of sequence V with respect to total order $\preceq$ $G_{min}$←{g:⟨g, v⟩ are from NEGHBORS-DIST, v=$v_{min}$}

⟨h, v⟩←⟨First element of $G_{min}$, $v_{min}$⟩

Line 7. For the description of MODULE-MULTIPLY see the description of Line 1. Conjugate transpose is easily computed by first transposing matrix h and then applying function * to each element of the matrix. As discussed in Section 4.2.1 the function * is easy to compute.

Line 8. Here h is appended to the end of the sequence w. For example, if w is equal to $g_1, \ldots g_k$ then the result of appending h to w is the sequence $g_1, \ldots, g_k$, h.

Line 10. At this point w is a sequence of unitaries over ring R (represented as matrices over field K) equal to $g_1, \ldots, g_n$. Then r is equal to the product $g_1 \cdot \ldots \cdot g_n$. In this line n matrix multiplication over field K is performed.

Line 11. In this line two conjugate transpose operations and matrix multiplication are performed. Matrix multiplication is very simple to implement. The implementation of conjugate transpose is discussed above (see the description of Line 7).

Line 12. This line is similar to Line 8.

4.2.3. Procedure DIST.

```
1: procedure DIST(p, M', M)
2:   N ← MODULE-INTERSECT(M', M)
3:   [∂₁, ..., ∂_d] ← ELEMENTARY-DIVISORS(M, N)
4:   return [P-ADIC-VALUATION(p, ∂₁), ..., P-ADIC-VALUATION(p, ∂_d)]
5: end procedure
```

Line 2. Here a torsion-free R-module N which is equal to the intersection of the torsion-free R-modules M and M' is computed. Algorithms for this are well known. One example of such an algorithm is Algorithm 1.5.1 in Section 1.5.2 in Cohen 1. Its implementation relies on Hermite Normal Form algorithm. Hermite normal form algorithms for $O_K$-modules are implemented in Magma and PARI-GP. Algorithm for computing the intersection of modules is available in Magma. For example, see "Modules" and "Modules Over Dedekind Domains" in Magma-HB). Text use Line 3. On this line a sequence of $O_K$ ideals $[\mathfrak{d}_1, \ldots, \mathfrak{d}_d]$ that are elementary divisors of quotient M'/N is computed. This sequence is defined in the following theorem (see Theorem 1.2.35 in Cohen 1):

Theorem 3 (Elementary divisors). Let R be a Dedekind domain with fraction field K, let M',N be torsion-free R-modules of rank d and M ⊂ N then there exist a basis $b_1, \ldots, b_d$ of $K^d$ and R-ideals $\mathfrak{b}_1, \ldots, \mathfrak{b}_d, \mathfrak{d}_1, \ldots \mathfrak{d}_d$ such that $$M = \mathfrak{b}_1 \mathfrak{d}_1 b_1 + \ldots + \mathfrak{b}_d \mathfrak{d}_d b_d$$

$$N = \mathfrak{b}_1 b_1 + \ldots + \mathfrak{b}_d b_d$$

and $\mathfrak{d}_{i-1} \subset \mathfrak{d}_i$ for i=2, ..., d. Ideals $\mathfrak{d}_1, \ldots, \mathfrak{d}_d$ called elementary divisors.

The algorithm for computing these ideals is well-known and described in Chapter 1.7 in Cohen 1. Its implementation is available in both Magma and PARI-GP. This algorithm is sometimes called the Smith Normal Form Algorithm that is implemented as sub-routine nfsnf in PARI-GP (see 3.6.114 of the PARI-GP User Guide). The algorithm is also available in Magma (see, for example, "Modules" and "Modules Over Dedekind Domains" in Magma-HB.

Line 4. Here $\mathfrak{p}$-adic valuations of each of $O_K$ ideals are $\mathfrak{d}_k$ are computed. The algorithms for computing $\mathfrak{p}$ adie valuation of an ideal are well-known. An example of such an algorithm is Algorithm 4.8.17 of Cohen 2. The implementation of such such algorithms is available in Magma and PARI-GP. For example, see "Global Arithmetic Fields" and "Number Fields and Orders" in Magma-HB.

4.3. Specific Examples

4.3.1. Optimal Qutrits Exact Synthesis.

Before we describe the algorithm we introduce the following definitions:

Definition.

Field $\mathbb{Q}(\zeta_3)$ (known as 3-d cyclotomic field) is (isomorphic to) the following sub-field of complex numbers $$\{a_0 + a_1 \zeta_3 : a_0, a_1 \in \mathbb{Q}\}$$

where $\zeta_3 = e^{2\pi i/3}$.

Ring $\mathbb{Z}[\zeta_3]$ is ring of integers of $\mathbb{Q}(\zeta_3)$.

Ring $$\mathbb{Z}\left[\frac{1}{1+2\zeta_3}, \zeta_3\right]$$

is isomorphic to the sub-ring of complex numbers $\{z/(1+2\zeta_3)^k : z \in \mathbb{Z}[\zeta_3], k \in \mathbb{Z}\}$.

The involution * is defined using relation $\zeta^*_3 = \zeta_3^2$.

Definition.

The qutrit Clifford group $C_3$ is the group of unitary matrices over ring $$\mathbb{Z}\left[\frac{1}{1+2\zeta_3}, \zeta_3\right]$$

generated by:

(4.1)

$$X = \begin{pmatrix} 0 & 0 & 1 \\ 1 & 0 & 0 \\ 0 & 1 & 0 \end{pmatrix}, Z = \begin{pmatrix} 1 & 0 & 0 \\ 0 & \zeta_3 & 0 \\ 0 & 0 & \zeta_3^2 \end{pmatrix}, S = \begin{pmatrix} 1 & 0 & 0 \\ 0 & \zeta_3^2 & 0 \\ 0 & 0 & \zeta_3^2 \end{pmatrix},$$

$$F = \frac{1}{3}\begin{pmatrix} -(1+2\zeta_3) & -(1+2\zeta_3) & -(1+2\zeta_3) \\ -(1+2\zeta_3) & \zeta_3 - 1 & \zeta_3 + 2 \\ -(1+2\zeta_3) & \zeta_3 + 2 & \zeta_3 - 1 \end{pmatrix} \text{ and }$$

$$M_2 = \begin{pmatrix} 1 & 0 & 0 \\ 0 & 0 & 1 \\ 0 & 1 & 0 \end{pmatrix}.$$

Group $C_3$ is well-studied in the literature. For example, see Hostens et al., *Stabilizer states and Clifford operations for systems of arbitrary dimensions, and modular arithmetic*, available at http://arxiv.org/abs/quant-ph/0408190 ("Hostens").

Definition.

Matrix $T_3$ is $$T_3 = \begin{pmatrix} 1 & 0 & 0 \\ 0 & 1 & 0 \\ 0 & 0 & -1 \end{pmatrix}$$

Definition.

Lexicographical order $\preceq_{lex}$ on a set $\mathbb{Z}^d$ is defined by the following rules:

(1) $(n_1, \ldots, n_d) \preceq_{lex} (n'_1, \ldots, n'_d)$ if $n_1 < n'_1$ (2) $(n_1, \ldots, n_d) \preceq_{lex} (n'_1, \ldots, n'_d)$ if $n_1 = n'_1$ and $(n_2, \ldots, n_d) \preceq (n_2, \ldots, n'_d)$ (3) on $\mathbb{Z}^1$ total order $\preceq$ equal to the total order $\leq$ on $\mathbb{Z}$ Definition.

Graded lexicographical order $\preceq_{gr}$ on a set $\mathbb{Z}_{\geq 0}^d$ is defined by the following rules:

(1) $(n_1, \ldots, n_d) \preceq_{gr} (n'_1, \ldots, n'_d)$ if $\Sigma_{k=1}^d n_d < \Sigma_{k=1}^d n'_d$ (2) $(n_1, \ldots, n_d) \preceq_{gr} (n'_1, \ldots, n'_d)$ if $\Sigma_{k=1}^d n_d = \Sigma_{k=1}^d n'_d$ and $(n_1, \ldots, n_d) \preceq_{lex} (n'_1, \ldots, n'_d)$ The parameters for qutrit exact synthesis algorithm are the following:

$K = \mathbb{Q}(\zeta_3)$ is a number field and $O_K = \mathbb{Z}[\zeta_3]$ is its ring of integers $$R = \mathbb{Z}\left[\frac{1}{1+2\zeta_3}, \zeta_3\right]$$

is a sub-ring of $\mathbb{Q}(\zeta_3)$, $\mathfrak{p} = (1+2\zeta_3)\mathbb{Z}[\zeta_3]$ is a prime ideal of $O_K = \mathbb{Z}[\zeta_3]$ $L = L_3$ is certain a torsion free $O_K = \mathbb{Z}[\zeta_3]$ module of rank 3 generated by vectors $(1+2\zeta_3)|0\rangle$, $(1+2\zeta_3)|1\rangle$, $(1+2\zeta_3)|2\rangle$, $|0\rangle + |1\rangle + |2\rangle$. The algorithms for computing $O_K$ modules based on vectors that generate them are well known and described in Cohen 1.

$\preceq = \preceq_{gr}$ is a graded lexicographical total order on $\mathbb{Z}_{\geq 0}^3$ $G_{ED} = \{CT_3 C^\dagger : C \in C_3\}$ is a finite set of unitaries over $$\mathbb{Z}\left[\frac{1}{1+2\zeta_3}, \zeta_3\right]$$

$G_L = C_3$ is a qutrit Clifford group

A prototype of the algorithm was implemented in Magma. It was also proven to terminate and produce optimal results for a cost function that assigns 1 to all elements of $G_{ED}$ and 0 to all elements of $G_L$.

Remark.

In this special case for the algorithm to work it is sufficient to compute the sum of the elements of the vector produced by procedure DIST. This sum can be computed more efficiently without using the Smith Normal Form algorithm.

4.3.2. Multiple Qubit Exact Synthesis for Clifford+T.

Let N be a number of qubits. Before we describe the algorithm we introduce the following definitions:

Definition.

Field $\mathbb{Q}(\zeta_8)$ (known as 8-th cyclotomic field) is the following sub-field of complex numbers $$\{a_0 + a_1 \zeta_8 + a_2 \zeta_8^2 + a_3 \zeta_8^3 : a_0, \ldots, a_3 \in \mathbb{Q}\}$$

where $\zeta_8 = e^{2\pi i / 8}$.

Ring $\mathbb{Z}[\zeta_8]$ is ring of integers of $\mathbb{Q}(\zeta_8)$.

Ring $$\mathbb{Z}\left[\frac{1}{1+\zeta_8}, \zeta_8\right]$$

is isomorphic to the sub-ring of complex numbers $\{z/(1+\zeta_8)^k : z \in \mathbb{Z}[\zeta_8], k \in \mathbb{Z}\}$.

The involution * is defined using relation $\zeta_8^* = \zeta_8^7$.

Definition.

Pauli matrices $\mathcal{P} = \{I, X, Y, Z\}$ are matrices over ring $$\mathbb{Z}\left[\frac{1}{1+\zeta_8}, \zeta_8\right]$$

defined as $$I = \begin{pmatrix} 1 & 0 \\ 0 & 1 \end{pmatrix}, X = \begin{pmatrix} 0 & 1 \\ 1 & 0 \end{pmatrix}, Y = \begin{pmatrix} 0 & -i \\ i & 0 \end{pmatrix}, Z = \begin{pmatrix} 1 & 0 \\ 0 & -1 \end{pmatrix},$$

where $i = \zeta_8^2$ N-qubit Pauli group $\mathcal{P}_N$ is equal to $$\{\pm i P_1 \otimes \ldots \otimes P_N : P_k \in \mathcal{P}\}$$

where $\otimes$ denotes tensor product of matrices over field $\mathbb{Q}(\zeta_8)$.

Every matrix $P_1 \otimes \ldots \otimes P_n$ is a $2^N \times 2^N$ unitary matrix over the ring $$\mathbb{Z}\left[\frac{1}{1+\zeta_8}, \zeta_8\right].$$

Definition.

The N-qubit Clifford group is a group of unitary matrices over ring $$\mathbb{Z}\left[\frac{1}{1+\zeta_8}, \zeta_8\right]$$

defined as

Clifford$_N = \{U$:for all $P \in \mathcal{P}$ it is the case that $U \cdot P \cdot U^\dagger \in \mathcal{P}\}$ In other words, the N-qubit Clifford is group is the group of all unitaries over the ring $$\mathbb{Z}\left[\frac{1}{1+\zeta_8}, \zeta_8\right]$$

that map elements of N-qubit Pauli group $\mathcal{P}_n$ to themselves by conjugation. Groups Clifford$_N$ are well-studied in the literature. For example, see Hostens. Group Clifford$_N$ is known to be finite.

The parameters for multi qubit exact synthesis algorithm are the following:

$K = \mathbb{Q}(\zeta_8)$ is a number field and $O_K = \mathbb{Z}[\zeta_8]$ is its ring of integers $$R = \mathbb{Z}\left[\frac{1}{1+\zeta_8}, \zeta_8\right]$$

is a sub-ring of $\mathbb{Q}(\zeta_8)$, $\mathfrak{p} = (1+\zeta_8)\mathbb{Z}[\zeta_8]$ is a prime ideal of $O_K = \mathbb{Z}[\zeta_8]$ $L=L_{BW}$ is a torsion free $O_K=\mathbb{Z}[\zeta_8]$ module of rank $d=2^N$ know in the literature as the complex Barnes-Wall lattice. $L_{BW}$ is the $O_K$-module generated by the following set of vectors:

$$\{v_1 \otimes v_2 \otimes \ldots \otimes v_N : v_k \text{ are from the set } \{s|0\rangle, s|1\rangle, |0\rangle + |2\rangle\}\}$$

where $s=\zeta_8+\zeta_8^{-1}$, $|0\rangle=(1, 0)^T$ and $|1\rangle=(0, 1)^T$. Vectors $v_k$ are elements of the vector space $K^2$ (two dimensional vector space with the field of scalars K). Operation $\otimes$ is a tensor product of two vectors over base field K. The dimension of vector $v_1 \otimes v_2 \otimes \ldots \otimes v_N$ is $d=2^N$.

$\preceq = \preceq_{gr}$ is a graded lexicographical total order on $\mathbb{Z}_{\geq 0}^d$ $G_{ED}$. The definition of $G_{ED}$ requires several steps. Let us first define abelian subgroup of $\mathcal{P}_N$ $$\mathcal{Z}_N = \{P_1 \otimes \ldots \otimes P_N : P_k \in \{I, Z\}\}$$

For arbitrary g from $\mathcal{Z}_N$ and abelian subgroup H of $\mathcal{Z}_N$ define $$c_k(g, H) = \exp\left(\frac{\pi i}{2^{k+1}} \sum_{h \in H} gh\right).$$

Operation exp above denotes matrix exponentiation. Let us denote the size of H as |H| and define set of unitaries over $$\mathbb{Z}\left[\frac{1}{1+\zeta_8}, \zeta_8\right]$$

as $$G' = \{c_k(g, H) : g \in \mathcal{Z}_N, H \text{ is an abelian subgroup of } \mathcal{Z}_N \text{ and } k \leq \log_2 |H|\}$$

Finally $$G_{ED} = \{CUC^\dagger : C \text{ is from Clifford}_N \text{ and } U \text{ is from } G'\}$$

$G_L = \text{Clifford}_N$ is an N-qubit Clifford group

The algorithm was proven to terminate for 2 qubits. Empirical results suggest that it is much better than previous state of the art.

4.4. The State Preparation Algorithms

Here we describe a family of exact state preparation algorithms. The generic algorithm has a set of parameters that define a specific instance of it. These are the same parameters as for the exact synthesis algorithms. For the description of the parameters see the beginning of the Section 4.2.

---

Algorithm 2 Lattice based exact state preparation

---

Input: v is a d-dimensional vector over ring R of squared length 1 (in other words, a state of a qudit)
Output: Sequence $g_1, \ldots, g_n$, u where $g_k$ are from $G_{ED}$, and $s = g_1 \cdot \ldots \cdot g_n$ u$|0\rangle$ where $|0\rangle$ is a d-dimensional vector equal to $(1, 0, \ldots, 0)^T$
1: $M_0 \leftarrow$ MODULE-CONSTRUCT($\mathfrak{p}$, v)
2: $M \leftarrow$ MODULE-ADD(L, $M_0$)
3: NEIGHBORS $\leftarrow \{\langle g, \text{MODULE-MULTIPLY}(g, L)\rangle : g \in G_{ED}\}$
4: w $\leftarrow$ empty ordered sequence

---

-continued

---

Algorithm 2 Lattice based exact state preparation

---

5: while IS-EQUAL(M,L) do
6:    NEIGHBORS-DIST $\leftarrow \{\langle g, \text{INDEX(MODULE-ADD}(M_0, M'), M')\rangle : \langle g, M'\rangle \in$ NEIGHBORS$\}$
7:    Find an element $\langle h, dst\rangle$ of NEIGHBORS-DIST such that integer dst is smallest possible
8:    v $\leftarrow h^\dagger$v
9:    $M_0 \leftarrow$ MODULE-CONSTRUCT($\mathfrak{p}$, v)
10:   M $\leftarrow$ MODULE-ADD(L, $M_0$)
11:   Append h to w
12: end while
13: u $\leftarrow$ any element of $\{g \in G_L : v = g|0\rangle\}$
14: Append u to w
15: return w

---

4.5. Algorithm Details

Line 1. In this step we construct a data structure representing torsion free $O_K$-module of rank 1 equal to $\mathfrak{p}$v. This step is straightforward if one uses pseudo-matrices to represent such a module. PARI-GP uses pseudo-matrices. Magma can construct data structure for representing torsion free $O_K$-modules based on pseudo-matrices. For example, see Part "Modules" and "Modules Over Dedekind Domains" in Magma-HB.

Line 2. Procedure MODULE-ADD constructs an $O_K$-module equal to the sum of $O_K$-modules L and $M_0$. Algorithms for computing the sum of modules are well known. Their implementation is available in Magma and PARI-GP. One of such algorithms is described in Chapter 1.5.2 "Operations on Modules and Maps" in Cohen I.

Line 3. This line is the same as the Line 2 of the exact synthesis Algorithm 1. See Section 4.2 for its description.

Line 5. This line is the same as the Line 4 of the exact synthesis Algorithm 1. See Section 4.2 for its description.

Line 6. Here we compute a sequence of tuples $\langle g, dst'\rangle$ where g is a unitary over the ring R and dst' is an integer. This line can be written as the following FOR loop:

---

NEIGHBORS-DIST $\leftarrow$ empty ordered sequence
for k = 1 to LENGTH(NEIGHBORS) do
   $\langle g, M'\rangle \leftarrow$ k-th element of sequence NEIGHBORS
   v' $\leftarrow$ INDEX ($\mathfrak{p}$, M, M')
   append $\langle g, v'\rangle$ to NEIGHBORS
end for

---

Procedure INDEX can be described as following:

--- procedure INDEX(M, M')
   $(dst_1, \ldots, dst_d) = \text{DIST}(M', M) \triangleright$ DIST Described in FIG. ?? and in Section 0
   return $\Sigma_{k=1}^d dst_k$
end procedure

---

There are many ways to implement procedure INDEX that can be more efficient in practice. The description provides a representative example.

Line 7. This line can be performed using any variant of one on many well known selection algorithms. This can be expressed equivalently using the following:

$V \leftarrow \{v : \langle g, v | \in \text{NEIGHBORS-DIST}\}$ $v_{min} \leftarrow$ Minimum of sequence $V$ $G_{min} \leftarrow \{g : \langle g, v |$ are from NEIGHBORS-DIST, $v = v_{min}\}$ $\langle h, v | \leftarrow \langle$ First element of $G_{min}, v_{min} |$ Line 8. In this line we first perform conjugate transpose of a d×d matrix h over the number field K. Next we perform matrix vector multiplication. Both operations are well-known. We discussed conjugate transpose in more details in Section 4.2.2.

Line 9. The same as Line 1. See the description above.

Line 10. The same as Line 2. See the description above.

Line 11. Here we append h to the end of the sequence w. For example, if w is equal to $g_1, \ldots g_k$ then the result of appending h to w is the sequence $g_1, \ldots, g_k, h$.

Line 13. In this line we find an element of $G_L$ that transforms $|0\rangle$ into v. A possible way to do this is to:

(1) compute sequence S of all pairs $\langle g, g|0\rangle \rangle$ for all g from $G_L$. This can be done because $G_L$ is specified as a finite sequence.

(2) find a pair $\langle u', v|$ in S for some u', set u to u'

Line 14. The same as Line 11.

We implemented the prototypes of the exact state preparation algorithms for the same set of parameters as the exact synthesis algorithm described in Section 4.2. For more details on these parameters see Section 4.3.

4.6. Representative Circuits and Methods

Referring to FIG. 1, a representative circuit for exact implementation of unitary U includes a qutrit, qudit, or multiple qubit 102 have an initial state that is coupled to a series of gates 104 that includes gates $110_1$-$110_N$. In addition, an additional gate 106 is used. Application of the series of gates 104 and the gate 106 to the qutrit, qudit, or multiple qubit 102 results in an output state 110 corresponding to application of the unitary U. In some cases, the series of gates 102 and the gate 106 are associated with implementation of a unitary while in other examples, production of a particular state such as $|\Psi_F\rangle$ is desired.

Figure 2:
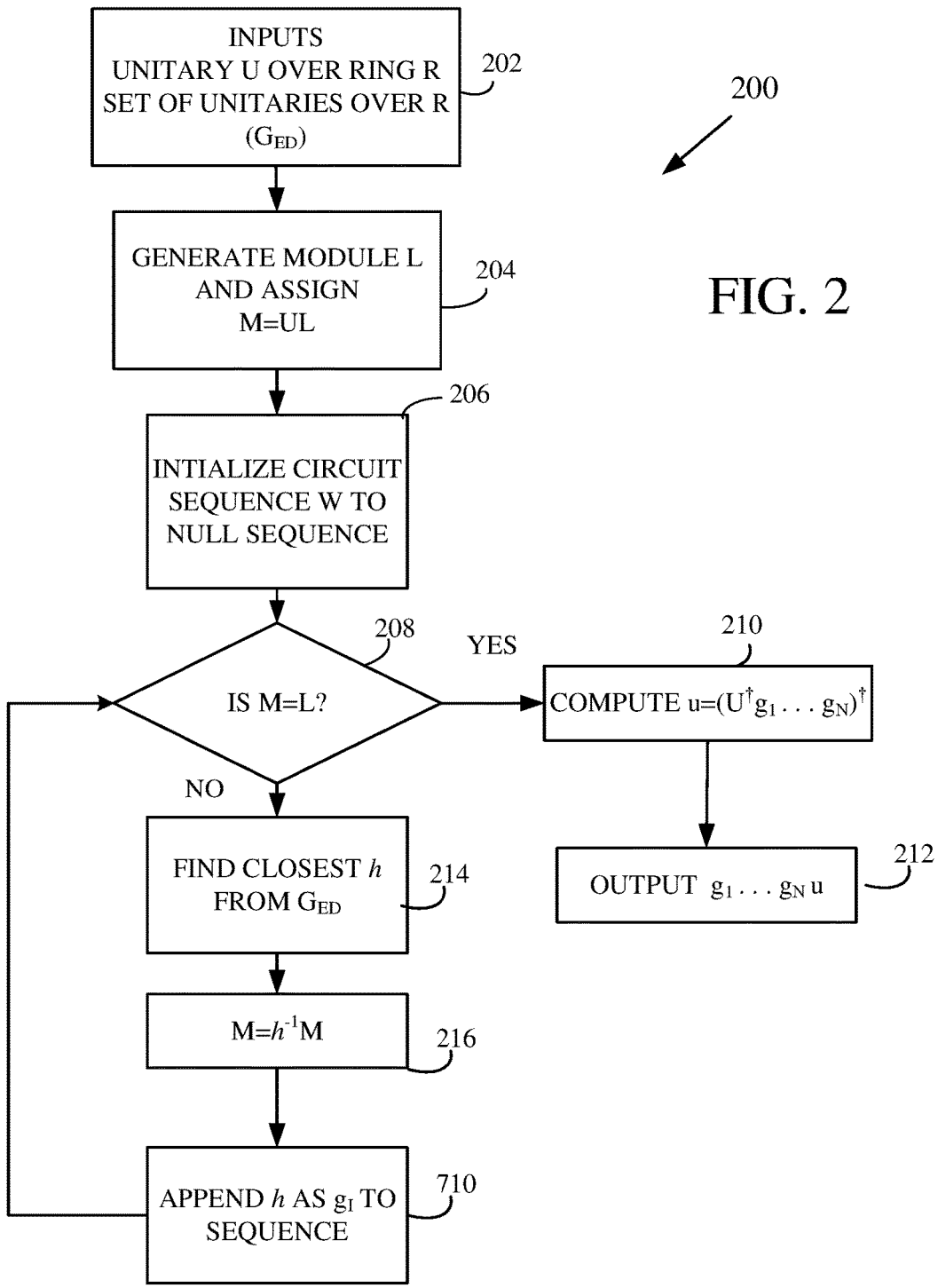
FIG. 2 illustrates a representative method of exact synthesis.

Referring to FIG. 2, a representative method 200 includes receiving a unitary and a basis set of unitaries at 202. At 204, the module L is generated along with the module UL At 206, a circuit sequence is initialized, and at 208, it is determined whether L and M are equal. If so, a final element u of a circuit synthesis is determined at 210 and the synthesized sequence is output at 212. Otherwise, at 214, a closest basis gate is selected at 214 and M is updated at 216 based on the selected gate h. At 218, h is appended to the gate sequence, and processing returns to 208.

4.7. Quantum and Classical Processing Environments

Figure 3:
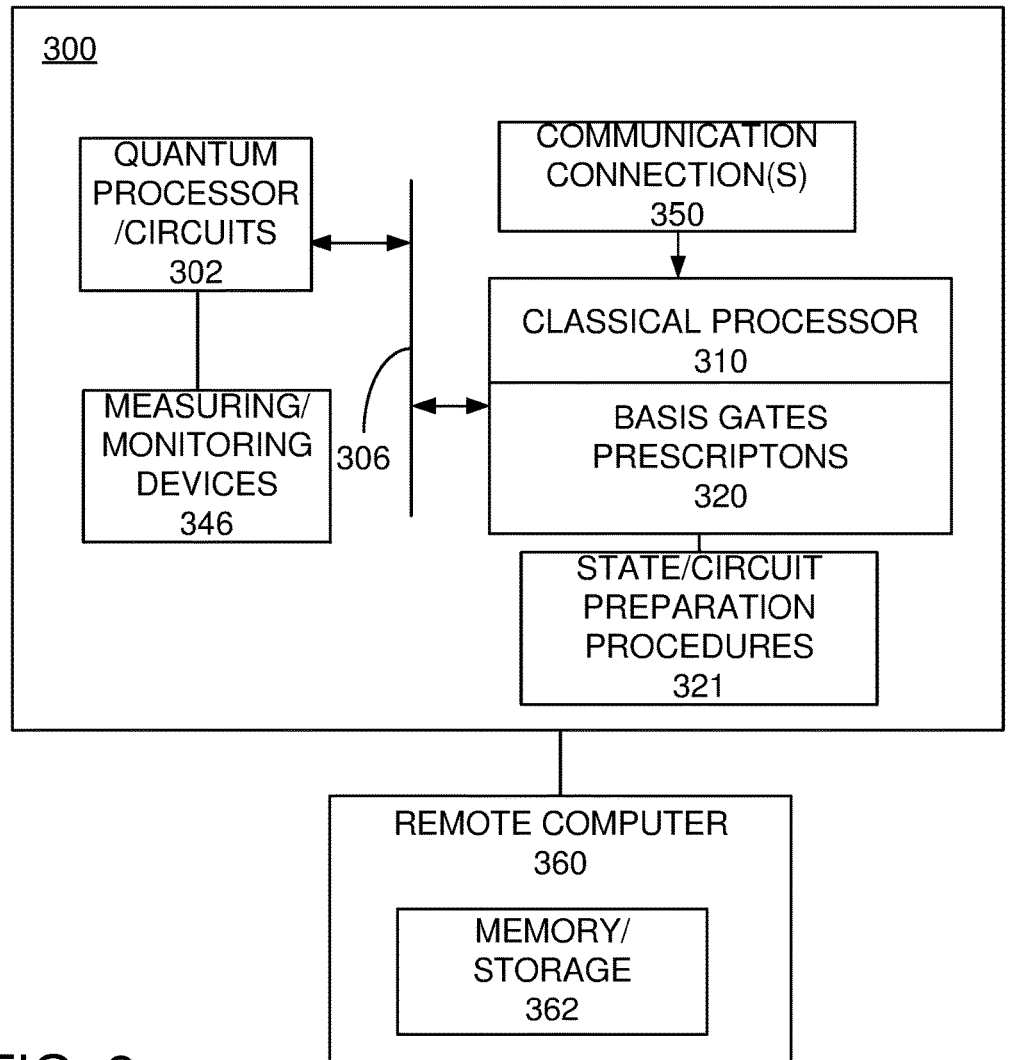
FIG. 3 illustrates a representative computing environment that includes classical and quantum computing that implements the disclosed methods and provides corresponding synthesized circuits.

With reference to FIG. 3, an exemplary system for implementing some aspects of the disclosed technology includes a computing environment 300 that includes a quantum processing unit 302 and one or more monitoring/measuring device(s) 346. The quantum processor executes quantum circuits (such as the circuits of FIG. 3) that are precompiled by classical compiler unit 320 utilizing one or more classical processor(s) 310.

With reference to FIG. 3, the compilation is the process of translation of a high-level description of a quantum algorithm into a sequence of quantum circuits. Such high-level description may be stored, as the case may be, on one or more external computer(s) 360 outside the computing environment 300 utilizing one or more memory and/or storage device(s) 362, then downloaded as necessary into the computing environment 300 via one or more communication connection(s) 350. Alternatively, the classical compiler unit 320 is coupled to a classical processor 310 and a procedure library 321 that contains some or all procedures or data necessary to implement the methods described above such as determining an exact synthesis of a unitary or determining a series of gates needed to obtain a specific quantum state. A communication bus couples instructions and data to and from the quantum processor 302, the measuring and monitoring devices 346, and the classical processor 320. In this way, circuit definitions from the compiler unit 320 or measurement results from the measuring and monitoring devices 346 (or other data) can be communicated.

Figure 4:
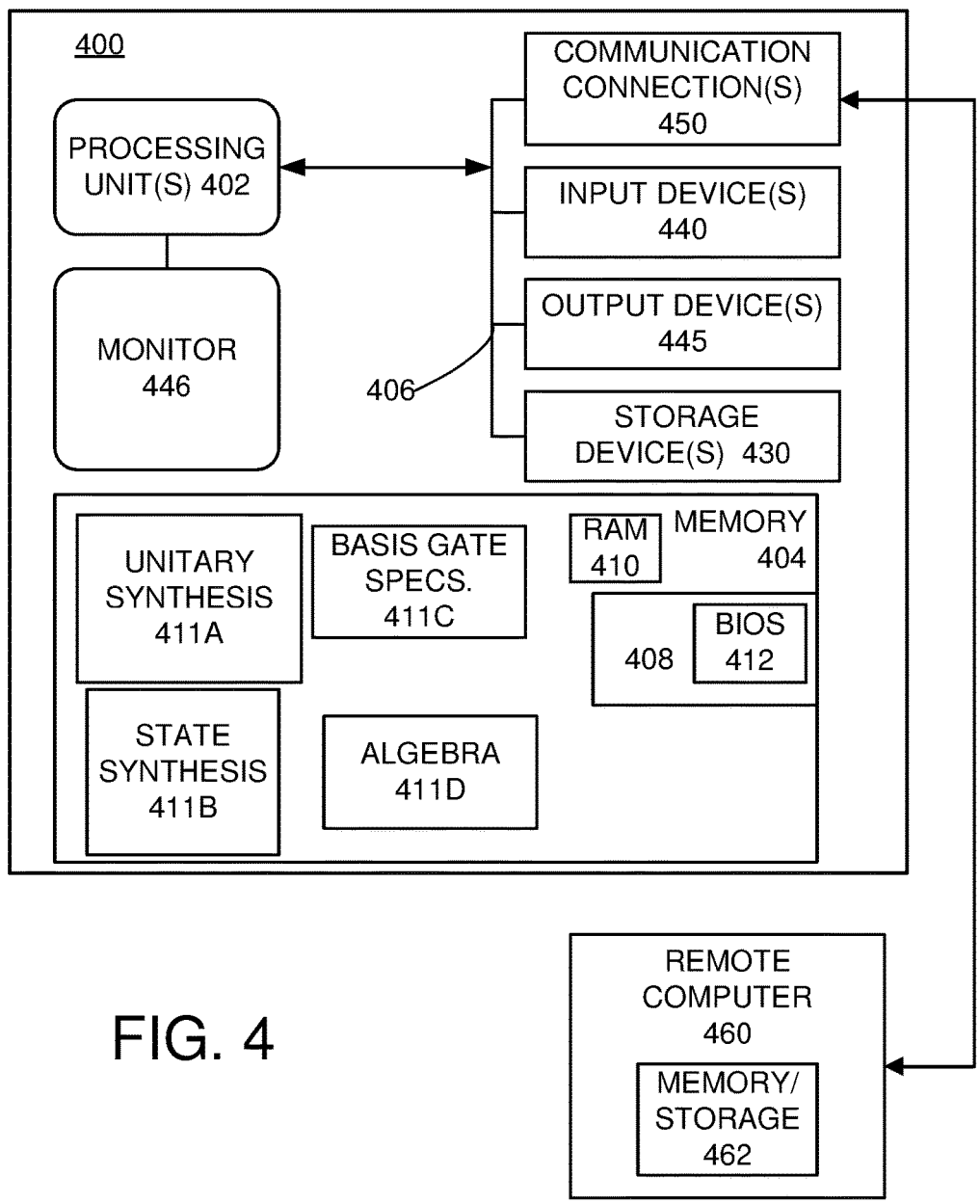
FIG. 4 illustrates a representative classical computing environment for implementation of the disclosed methods.

FIG. 4 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. Typically, a classical computing environment is coupled to a quantum computing environment, but a quantum computing environment is not shown in FIG. 4.

With reference to FIG. 4, an exemplary system for implementing the disclosed technology includes a general purpose computing device in the form of an exemplary conventional PC 400, including one or more processing units 402, a system memory 404, and a system bus 406 that couples various system components including the system memory 404 to the one or more processing units 402. The system bus 406 may be any of several types of bus structures including a memory bus or memory controller, a peripheral bus, and a local bus using any of a variety of bus architectures. The exemplary system memory 404 includes read only memory (ROM) 408 and random access memory (RAM) 410. A basic input/output system (BIOS) 412, containing the basic routines that help with the transfer of information between elements within the PC 400, is stored in ROM 408.

As shown in FIG. 4, instructions and specifications for basis gate sets are stored at 411C and computer algebra procedures and definitions are stored at 411D. Procedures for exact synthesis of a unitary are stored at 411A, and state synthesis specifications are stored at 411B.

The exemplary PC 400 further includes one or more storage devices 430 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 406 by a hard disk drive interface, a magnetic disk drive interface, and an optical drive interface, respectively. The drives and their associated computer readable media provide nonvolatile storage of computer-readable instructions, data structures, program modules, and other data for the PC 400. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 430 including an operating system, one or more application programs, other program modules, and program data. Storage of computer-executable instructions for defining circuits for exact unitary synthesis and state synthesis, and configuring a quantum computer can be stored in the storage devices 430 as well as or in addition to the memory 404. A user may enter commands and information into the PC 400 through one or more input devices 440 such as a keyboard and a pointing device such as a mouse. Other input devices may include a digital camera, microphone, joystick, game pad, satellite dish, scanner, or the like. These and other input devices are often connected to the one or more processing units 402 through a serial port interface that is coupled to the system bus 406, but may be connected by other interfaces such as a parallel port, game port, or universal serial bus (USB). A monitor 446 or other type of display device is also connected to the system bus 406 via an interface, such as a video adapter. Other peripheral output devices 445, such as speakers and printers (not shown), may be included. In some cases, a user interface is display so that a user can input a unitary or a desired state.

The PC 400 may operate in a networked environment using logical connections to one or more remote computers, such as a remote computer 460. In some examples, one or more network or communication connections 450 are included. The remote computer 460 may be another PC, a server, a router, a network PC, or a peer device or other common network node, and typically includes many or all of the elements described above relative to the PC 400, although only a memory storage device 462 has been illustrated in FIG. 4. The personal computer 400 and/or the remote computer 460 can be connected to a logical a local area network (LAN) and a wide area network (WAN). Such networking environments are commonplace in offices, enterprise wide computer networks, intranets, and the Internet.

When used in a LAN networking environment, the PC 400 is connected to the LAN through a network interface. When used in a WAN networking environment, the PC 400 typically includes a modem or other means for establishing communications over the WAN, such as the Internet. In a networked environment, program modules depicted relative to the personal computer 400, or portions thereof, may be stored in the remote memory storage device or other locations on the LAN or WAN. The network connections shown are exemplary, and other means of establishing a communications link between the computers may be used.

In some examples, a logic device such as a field programmable gate array, other programmable logic device (PLD), an application specific integrated circuit can be used, and a general purpose processor is not necessary. As used herein, processor generally refers to logic devices that execute instructions that can be coupled to the logic device or fixed in the logic device. In some cases, logic devices include memory portions, but memory can be provided externally, as may be convenient. In addition, multiple logic devices can be arranged for parallel processing.

Whereas the invention has been described in connection with several example embodiments, it will be understood that the invention is not limited to these embodiments. On the contrary, the invention is intended to encompass all alternatives, modifications, and equivalents as may be included within the spirit and scope of the invention as defined by the appended claims.

What is claimed is:

1. A computer-implemented method, comprising:
   determining an exact representation of d×d unitary matrix U as a sequence of quantum gates representable mathematically as $g_0 \ldots g_n$ from a set G of d×d quantum gates over a ring with involution R, wherein d is an integer greater than one, and the quantum gate representable as $g_I$ of the sequence of gates is determined using a module $M_I = g_{I-1} M_{I-1}$, wherein I and n are integers and $M_{I-1}$ is a module used to obtain a previous quantum gate representable by $g_{I-1}$ and a gate representable by $g_I$ is selected as a lowest cost of the quantum gates of the set G, and $M_0 = UL$, wherein L is a torsion free module of rank d; and
   arranging a quantum circuit corresponding to the sequence of quantum gates representable as $g_0 \ldots g_n$.

2. The computer-implemented method of claim 1, further comprising: identifying a torsion-free R-module L and a subset $G_L$ of stabilizing quantum gates over R.

3. The computer-implemented method of claim 2, further comprising:
   identifying a complementary set of quantum gates $G_{ED}$ to represent the set of quantum gates G as a union of $G_{ED}$ and $G_L$.

4. The computer-implemented method of claim 1, wherein a complexity of representing the unitary matrix U is linked indirectly with a module M=UL, wherein L is a torsion-free R-module.

5. The computer-implemented method of claim 4, further comprising determining neighbor modules of a current module M.

6. The computer-implemented method of claim 5, wherein a nearest neighbor module M' of M is identified.

7. The computer-implemented method of claim 6, wherein a nearest neighbor module M' of M is identified based on a quotient of M and an intersection of M and M'.

8. The computer-implemented method of claim 7, wherein a nearest neighbor module M' of M is identified based on elementary divisors of a quotient of M and an intersection of M and M'.

9. The computer-implemented method of claim 8, further comprising
   identifying a complementary set of quantum gates $G_{ED}$ to represent the set of quantum gates G as a union of $G_{ED}$ and $G_L$; and
   selecting a quantum gate g from $G_{ED}$ that produces the nearest neighbor module M' from the current module M.

10. The computer-implemented method of claim 9, wherein the quantum gate g producing the nearest neighbor module M' of M is appended to a sequence register.

11. The computer-implemented method of claim 10, further comprising updating the current module M as $g^\dagger M$, wherein $g^\dagger$ is a conjugate transpose of g.

12. The computer-implemented method of claim 1, wherein d=3.

13. The computer-implemented method of claim 2, wherein $G_L$ is a one-qutrit Clifford group.

14. The computer-implemented method of claim 1, wherein d=4.

15. The computer-implemented method of claim 1, wherein $d=2^N$, wherein N is an integer greater than or equal to 3.

16. The computer-implemented method of claim 2, wherein $G_L$ is an N-qubit Clifford group.

17. A computer-implemented method comprising:
determining a sequence of quantum gates from a set G of d×d quantum gates representable over a ring with involution R so as to prepare a d-dimensional state S from a computational basis state, wherein d is an integer greater than 1; and
defining a quantum circuit based on the sequence of quantum gates.

18. The computer-implemented method of claim 17, further comprising:
identifying a torsion-free R-module L and a subset $G_L$ of stabilizing quantum gates over R, wherein the complexity of preparing the state S is linked indirectly with the module M=L+<S>.

19. A quantum computer configured to implement a unitary matrix, comprising:
a sequence of quantum basis gates representable as $g_1 \ldots g_N$ selected based on orderings of the gates of the basis set g determined using a product of the quantum basis gates with a torsion free module of rank d, and modules M' associated with products of an adjacent quantum gate in the sequence, wherein a gate represented as $g_I$ is determined using a module $M_I = g_{I-1} M_{I-1}$, wherein d, I, N are integers, and $M_0$ is associated with the product of the gates of the basis set with the torsion free module.

20. The quantum computer of claim 19, wherein $d=2^N$, wherein N is an integer greater or equal than 3.

21. A quantum computer, comprising:
a sequence of quantum basis gates based on orderings of the quantum gates of a basis set determined using a product of the quantum basis gates with a torsion free module and respective modules associated with previous quantum gates in the sequence, wherein each gate is determined using the previous quantum gate in the sequence and the module associated with the previous quantum gate in the sequence.

\* \* \* \* \*